United States Patent [19]

Segawa et al.

[11] 4,410,974
[45] Oct. 18, 1983

[54] CAPACITANCE DETECTION TYPE RECORD STYLUS AND METHOD FOR MAKING THE STYLUS

[75] Inventors: Keiji Segawa, Yamato; Masaki Murakami, Sagamihara; Keiichiro Doi, Yokohama, all of Japan

[73] Assignee: Victor Company of Japan, Limited, Yokohama, Japan

[21] Appl. No.: 300,451

[22] Filed: Sep. 8, 1981

[30] Foreign Application Priority Data

Sep. 9, 1980 [JP] Japan ............................... 55-125134

[51] Int. Cl.$^3$ ............................................... G11B 3/44
[52] U.S. Cl. ..................................... 369/126; 369/173
[58] Field of Search .......................... 369/71, 126, 173

[56] References Cited

U.S. PATENT DOCUMENTS 3,943,276 3/1976 Knitter .............................. 369/126

Primary Examiner—Robert L. Richardson
Attorney, Agent, or Firm—Lowe, King, Price & Becker

[57] ABSTRACT

A capacitance detection type record stylus comprises a body of artificial diamond having flat faces lying parallel to the crystal planes {111} and {100} wherein adjoining identical crystal planes are either {111} or {100}. A crystal plane {110} is formed between any two of the adjoining identical crystal planes by lapping the edge between them. A conductive material is deposited on the crystal plane {110} to form an electrode for detecting signals recorded as geometric variations on a recording medium. Because of the aligned carbon atoms beneath the crystal plane {110}, a substantial amount of the conductive material penetrates deeply into the diamond making the electrode resistant to wear.

5 Claims, 6 Drawing Figures

CAPACITANCE DETECTION TYPE RECORD STYLUS AND METHOD FOR MAKING THE STYLUS

BACKGROUND OF THE INVENTION

The present invention relates to a capacitance detection type record stylus which detects signals stored in the form of minute pits along tracks on a recording medium as geometric variations, and a method for making such styluses.

Various attempts have hitherto been made to provide a capacitance detection type record stylus which is resistant to abrasion that occurs as a result of contact with the surface of a capacitance disk spinning at significantly high speeds. More specifically, the stylus comprises a diamond body provided with an electrode extending downwardly to a face that makes contact with the record surface. To ensure a high degree of resistance to wear the electrode needs to be bonded strongly to the underlying crystallographic structure of carbon atoms that constitute the diamond body so that the conductive atoms are not dislocated under the rigorous conditions.

The prior art attempts involve bombarding the diamond body with high velocity conductive particles such as hafnium or titanium, or using similar techniques, to permit conductive atoms to penetrate into the diamond to form the electrode. However, satisfactory results have not been obtained due to the fact that the surface of the diamond on which the electrode is to be formed tends to present an obstacle to the introduction of particles and lattice defects occur in the bombarded crystal structure.

SUMMARY OF THE INVENTION

The present invention contemplates to use the crystal plane {110} as the electrode forming face of the diamond stylus body since the carbon atoms underlying the plane {110} are aligned to permit introduction of conductive atoms deep into the body. A greater amount of conductive atoms can thus be embedded into the crystal structure of the diamond to form an electrode having a strong bonding with the carbon atoms so that the electrode is rendered resistant to abrasion.

One approach to making the diamond stylus body would involve the use of naturally available diamond stones and cutting them into a desired shape. However, there is no consistency in crystal structure between natural diamond stones and it is extremely rare that such stones present the {110} crystal plane. The cutting process would require an X-ray analysis to locate the desired crystal plane and is thus economically prohibitive for mass production.

The present invention is characterized by the use of artificially made diamonds having flat faces which lie parallel to crystal planes {111} and {100} wherein any adjoining faces have the same crystal plane, either {111} or {100}. A crystal plane {110}, either flat, convex or concave, is formed between any two of the adjoining identical crystal planes by shaping the edge between them. A conductive material is then deposited on the plane {110} by bombarding it with high velocity ions, for example, to form the stylus electrode.

BRIEF DESCRIPTION OF THE DRAWINGS

The invention will be further described in detail given by way of example with reference to the accompanying drawings, in which.

DETAILED DESCRIPTION

Figure 1:
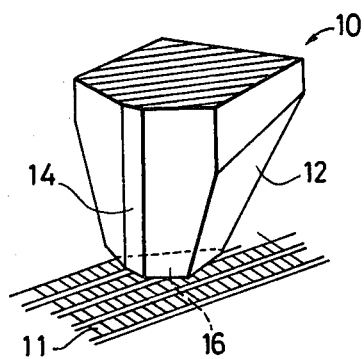
FIG. 1 is a perspective view of a capacitance detection type stylus of the invention shown as resting over several tracks of a grooveless capacitance disk record.

In FIG. 1 a capacitance detection type record stylus 10 for grooveless capacitance disks is shown as resting over several spiral or concentric tracks 11 of a disk record in which signals are stored as geometric variations in the form of minute pits. The stylus 10 comprises a diamond body 12 provided with a narrow strip electrode 14 which extends downward to a contact face 16 having a width of several tracks. This electrode is formed on a crystal plane {110} of the diamond body.

Figure 2:
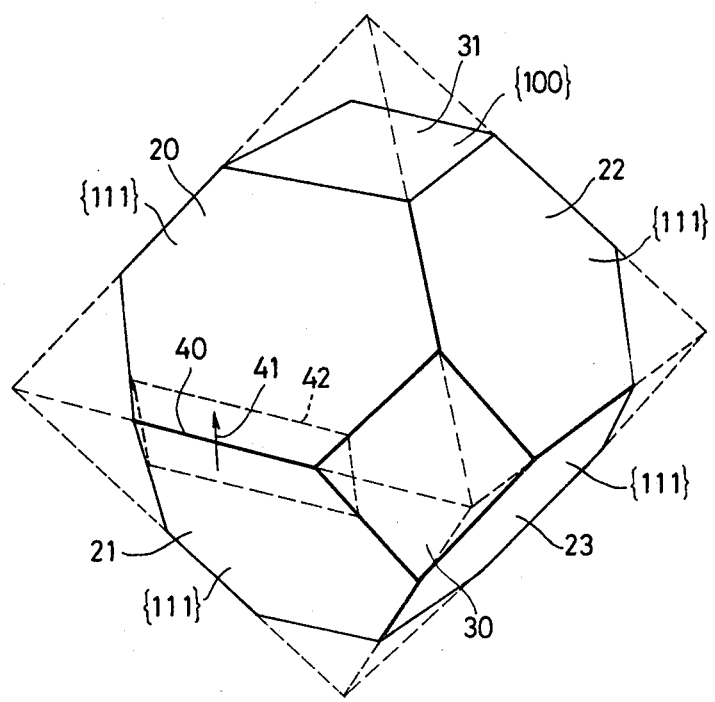
FIG. 2 is a perspective view of an artificial diamond in which the crystal plane {110} is formed between adjoining crystal planes {111}.

According to the invention the diamond body 12 is formed of an artificially made diamond, one example of which is shown in FIG. 2. This artificial diamond is cut from an octahedral body, shown in broken lines, so that adjoining hexagon-shaped faces 21, 22, 23, 24 lie parallel to crystal plane {111} and rectangular-shaped faces 30 and 31 lie parallel to crystal plane {100}. The artificial diamond of this type is available from General Electric as MPSD type diamonds and is found suitable for this invention since the crystal structure just described is in abundance in such artificial diamond. The crystal plane {110} is formed between adjoining faces 20 and 21, for example, of the identical crystal structure by lapping the boundary line 40 between them in opposite directions normal to the line 40 as indicated by an arrow 41. This lapping leaves the diamond body with an elongate face as indicated by a broken-line rectangle 42 which lies in a direction parallel to the crystal plane {110}.

Figure 3:
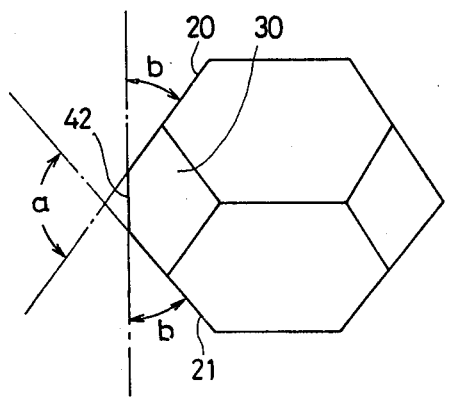
FIG. 3 is a side view of the diamond body of FIG. 2 showing the orientation of the crystal plane {110} relative to the adjacent planes {111}.

As clearly shown in FIG. 3, the adjoining faces 20 and 21 make an angle "a" of a known value. The lapping is carried out so that the elongate face 42 makes substantially equal angles "b" to the adjoining {111} planes 20 and 21 and the lengthwise edges are parallel to the boundary line 40 and a width slightly larger than 0.8 micrometers.

Figure 4:
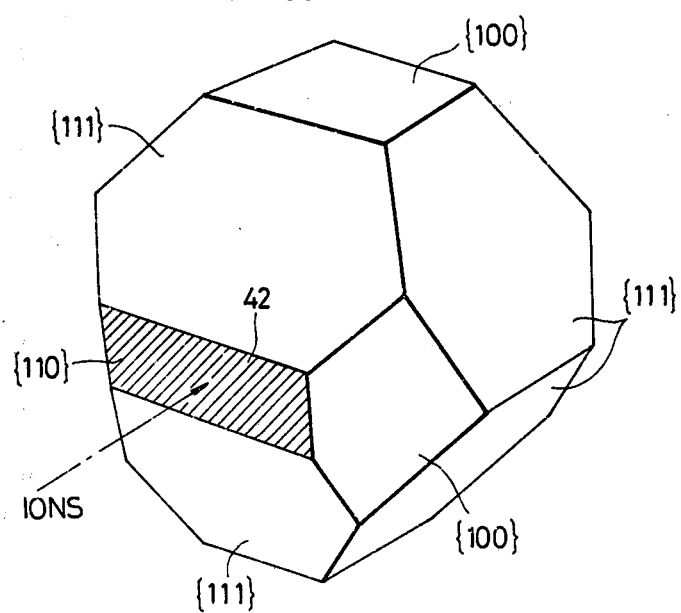
FIG. 4 is a perspective view of the diamond when bombarded with high velocity ions to form a stylus electrode.

In the atomic structure underlying the {110} crystal plane, the carbon atoms are aligned to permit conductive material or ions to penetrate unobstructed into a deeper region from the surface. After the lapping process, the {110} crystal plane 42 is bombarded with high velocity ions to form a conductive layer serving as the electrode 14 (see FIG. 4). Obviously, other techniques such as ion sputtering and vacuum deposition could also be employed for the electrode formation. Since the angle "a" is known in advance and the adjoining identical crystal planes are bounded by straight lines, the {110} crystal plane is formed in a short period of time with a high degree of precision by making use of the boundary line as a reference for the lapping operation.

Figure 5:
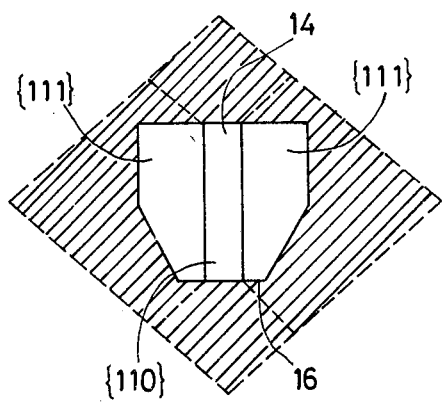
FIG. 5 is a front view of the diamond body when the latter is cut into a stylus form after formation of an electrode on the crystal plane {110}.

After the formation of the electrode 14, the diamond body is shaped to remove hatched portions as shown in FIG. 5 into a suitable form having the contact face 16.

Figure 6:
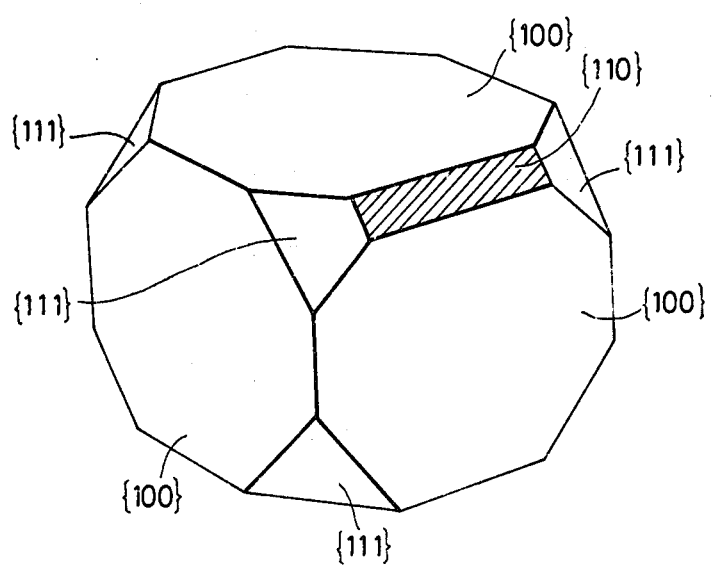
FIG. 6 is a perspective view of another example of the artificial diamond in which the crystal plane {110} is formed between adjoining crystal planes {100}.

Another example of the artificial diamond body is shown in FIG. 6. This diamond has octagon-shaped crystal planes {100} adjoined by straight boundary lines and triangular-shaped crystal planes {111} bounded by the {100} planes. The crystal plane {110} is also formed by lapping a boundary between any two of the {100} planes in a manner identical to that described above.

What is claimed is:

1. A capacitance detection type record stylus for detecting signals recorded as geometric variations along a track on a recording medium, comprising:

a body of diamond having a crystal plane {110} formed between adjoining planes of an identical crystallographic structure; and
    an electrode formed on said crystal plane {110} for detecting said signals.

2. A capacitance detection type record stylus as claimed in claim 1, wherein said diamond body is formed with a contact face which is adapted to make contact with said recording medium, said contact face having such a width that said stylus rests over several tracks of said recording medium, and wherein said electrode has a width substantially equal to the width of said track.

3. A capacitance detection type record stylus as claimed in claim 1, wherein said body comprises an artificially made diamond.

4. A capacitance detection type record stylus as claimed in claim 1, 2 or 3, wherein said crystal plane {110} is inclined at equal angles to said adjoining planes.

5. A capacitance detection type record stylus as claimed in claim 4, wherein said adjoining planes are parallel to crystal plane {111} or {100}.

* * * * *